United States Patent
Lane et al.

(10) Patent No.: US 11,306,193 B1
(45) Date of Patent: Apr. 19, 2022

(54) METHODS FOR FORMING ORDERED AND DISORDERED NANOVOIDED COMPOSITE POLYMERS

(71) Applicant: Facebook Technologies, LLC, Menlo Park, CA (US)

(72) Inventors: Austin Lane, Bellevue, WA (US); Jack Lindsay, Seattle, WA (US); Katherine Marie Smyth, Seattle, WA (US); Thomas John Farrell Wallin, Redmond, WA (US); Andrew John Ouderkirk, Redmond, WA (US); Tanya Malhotra, Redmond, WA (US); Christopher Yuan Ting Liao, Seattle, WA (US); Yigit Mengue, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 354 days.

(21) Appl. No.: 16/214,860

(22) Filed: Dec. 10, 2018

(51) Int. Cl.
| | | |
|---|---|---|
| *C08J 9/26* | (2006.01) | |
| *G03F 7/16* | (2006.01) | |
| *G03F 7/20* | (2006.01) | |
| *G03F 1/26* | (2012.01) | |
| *B05D 5/12* | (2006.01) | |

(Continued)

(52) U.S. Cl.
CPC ................... *C08J 9/26* (2013.01); *B05D 3/12* (2013.01); *B05D 5/12* (2013.01); *G03F 1/26* (2013.01); *G03F 7/16* (2013.01); *G03F 7/2002* (2013.01); *C08J 2300/12* (2013.01); *G02B 27/0172* (2013.01); *G02F 1/0128* (2013.01)

(58) Field of Classification Search
CPC ........... C08J 9/26; C08J 2300/12; B05D 3/12; B05D 5/12; G03F 1/26; G03F 7/16; G03F 7/2002; G02B 27/0172; G02F 1/0128
See application file for complete search history.

(56) References Cited

U.S. PATENT DOCUMENTS 6,436,608 B1 *   8/2002   Jin ........................... G03F 1/28
                                                                430/302
7,056,840 B2 *   6/2006   Miller .................. H01L 21/02348
                                                                438/781

(Continued)

OTHER PUBLICATIONS

Seo et al. "Reticulated Nanoporous Polymers by Controlled Polymerization-Induced Microphase Separation" Science vol. 336, Jun. 2012, pp. 1422-1425 (Year: 2012).*

(Continued)

*Primary Examiner* — Robert S Walters, Jr.
(74) *Attorney, Agent, or Firm* — FisherBroyles, LLP

(57) ABSTRACT

A method of forming a nanovoided composite polymer includes forming a resin-containing layer over a substrate, the resin-containing layer including a polymer-forming phase and a sacrificial phase, curing the polymer-forming phase to form a polymer matrix containing the sacrificial phase, and removing the sacrificial phase selectively with respect to the polymer matrix to form a nanovoided composite polymer including the polymer matrix and nanovoids dispersed throughout the polymer matrix. The nanovoids may be randomly or regularly dispersed throughout the matrix. Various other methods, systems, apparatuses, and materials are also disclosed.

14 Claims, 12 Drawing Sheets

(51) Int. Cl.
*B05D 3/12* (2006.01)
*G02B 27/01* (2006.01)
*G02F 1/01* (2006.01)

(56) References Cited

U.S. PATENT DOCUMENTS

2003/0157248 A1\* 8/2003 Watkins ............... B29C 67/202
427/256
2018/0093456 A1 4/2018 Van Overmeere et al.

OTHER PUBLICATIONS

Zhang et al. "Three-Dimensional Hierarchical Porous Structure of PPy/Porous-Graphene to Encapsulate Polysulfides for Lithium/Sulfur Batteries" Nanomaterials Aug. 2018, pp. 1-10. (Year: 2018).\*
Antonietti et al. "Carbon Aerogels and Monoliths: Control of Porosity and Nanoarchitecture via Sol-Gel routes" Chem. Mater. 2014, 26, 1, 196-210 (Year: 2014).\*
Demirdogen et al. "Silica coating of the pore walls of a microporous polycaprolactone membrane to be used in bone tissue engineering" J Biomed Mater Res A. 2014 102(9)3229-3236. (Year: 2014).\*
Mullin et al., "Pattern Transformation Triggered by Deformation", Physical Review Letters, vol. 99, No. 8, 2007, 4 pages.
Babaee et al., "3D Soft Metamaterials with Negative Poisson's ratio", Advanced Materials, vol. 25, No. 36, 2013, 18 pages.
Bertoldi et al., "Novel negative Poisson's ratio behavior induced by an elastic instability", Advanced Materials, vol. 22, No. 3, 2010, pp. 1-11.
Overvelde et al., "Relating pore shape to the non-linear response of periodic elastomeric structures", Journal of the Mechanics and Physics of Solids, vol. 64, 2014, 16 pages.
Shen et al., "Simple cubic three-dimensional auxetic metamaterials", Physic Status Solidi (B), vol. 251, No. 8, 2014, pp. 1515-1522.
Correa et al., "Negative Stiffness Honeycombs for Recoverable Shock Isolation", Rapid Prototyping Journal, vol. 21, No. 2, 2015, pp. 702-713.
Coulais et al., "Discontinuous Buckling of Wide Beams and Metabeams", Physical Review Letters, vol. 115, 2015, 7 pages.
Bickel et al., "Design and Fabrication of Materials with Desired Deformation Behavior", ACM Transactions on Graphics (TOG), vol. 29, No. 4, Jul. 2010, 10 pages.
Rosset et al., "Small, fast, and tough: Shrinking down integrated elastomer transducers", Applied Physics Reviews, vol. 3, No. 3, 2016, pp. 1-27.

Plante et al., "Large-scale failure modes of dielectric elastomer actuators", International Journal of Solids and Structures, vol. 43, 2006, pp. 7727-7751.
"Optotune DEAPs", Electroactive polymers, URL: https://www.optotune.com/technology/electroactive-polymers, 2019, 3 pages.
Product—Novasentis, "EMP Haptic Actuators For Sensory Innovation", URL: https://www.novasentis.com/product, 2019, 4 pages.
Rosset et al., "Mechanical characterization of a dielectric elastomer microactuator with ion-implanted electrodes", Sensor and Actuators A 144, 2008, 25 pages.
Gerratt et al., "Dielectric breakdown of PDMS thin films", Journal of Micromechanics and Microengineering, vol. 23, Apr. 26, 2013, 8 pages.
Hunt et al., "A self-healing dielectric elastomer actuator", Applied Physics Letters, vol. 104, 2014, 4 pages.
Skov et al., "Optimization Techniques for Improving the Performance of Silicone-Based Dielectric Elastomers", Advanced Engineering Materials, vol. 20, 2018, pp. 1-21.
Mazurek et al., "Glycerol as high-permittivity liquid filler in dielectric silicone elastomers", Journal of Applied Polymer Science, vol. 133, No. 43, 2016, 28 pages.
Rao et al., "Synthesis of flexible silica aerogels using methyltrimethoxysilane (MTMS) precursor", Journal of Colloid and Interface Science, vol. 300, 2006, pp. 279-285.
Seo et al., "Reticulated Nanoporous Polymers by Controlled Polymerization-Induced Microphase Separation", Science, vol. 336, Jun. 15, 2012, 5 pages.
Jennings, S.G., "The mean free path in air", Journal of Aerosol Science, vol. 19, No. 2, 1988, pp. 1-2.
Gupta et al., "Nanoemulsions: formation, properties and applications", Soft Matter, 2016, 16 pages.
Helgeson et al., "Mesoporous organohydrogels from thermogelling photocrosslinkable nanoemulsions", Nature Materials, vol. 11, Apr. 2012, pp. 344-352.
Guha et al., "Creating nanoscale emulsions using condensation", Nature Communications, 8:1371, 2017, pp. 1-7.
Meier et al., "Microemulsion elastomers", Colloid Polymer Science, vol. 274, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.

\* cited by examiner

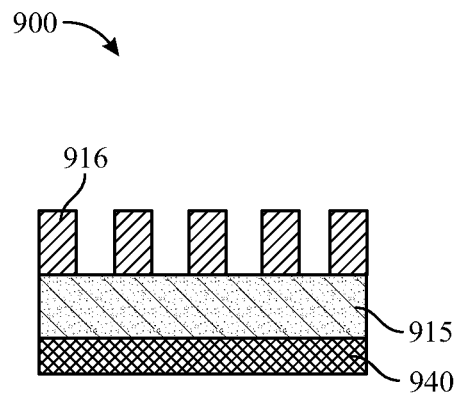
FIG. 9A
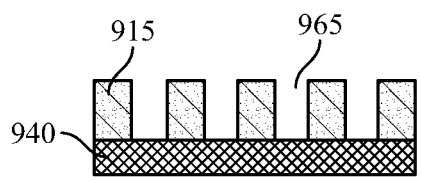
FIG. 9B
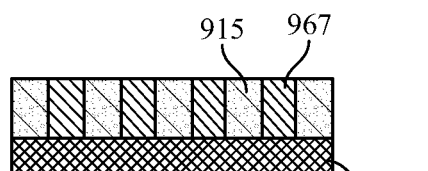
FIG. 9C
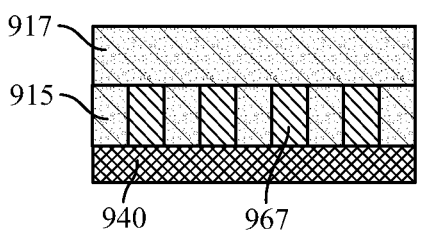
FIG. 9E
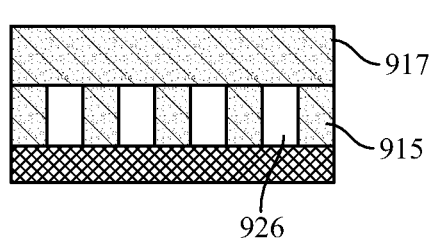
FIG. 9D
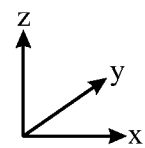

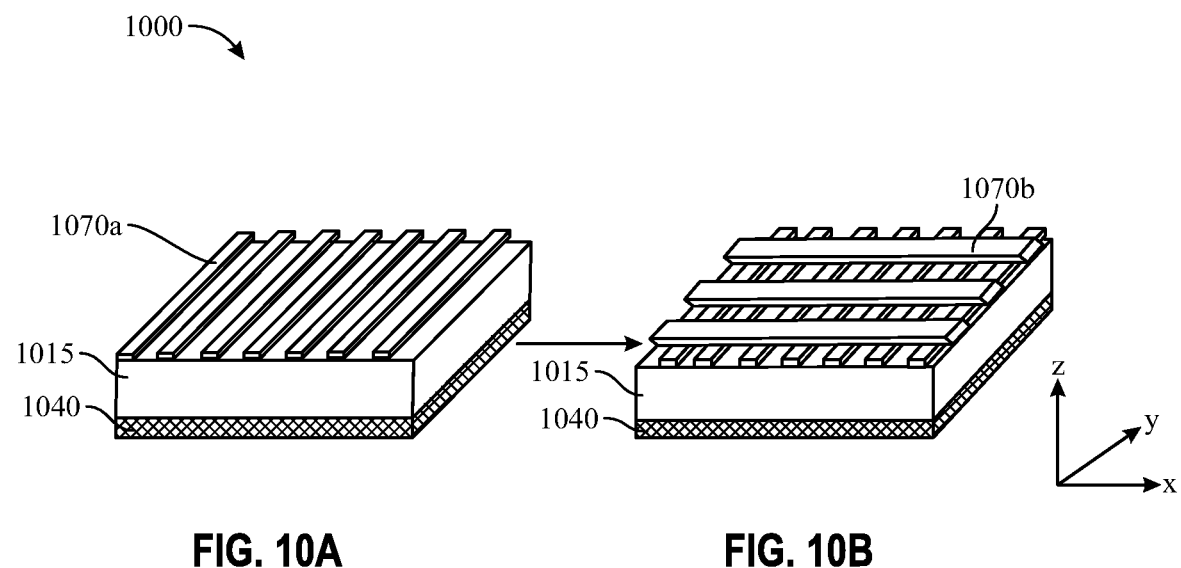
FIG. 10A  FIG. 10B

METHODS FOR FORMING ORDERED AND DISORDERED NANOVOIDED COMPOSITE POLYMERS

BACKGROUND

Polymer materials may be incorporated into a variety of different optic and electro-optic device architectures, including active and passive optics and electroactive devices. Electroactive polymer (EAP) materials, for instance, may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including the refractive index to manipulate light and/or in the example of electroactive applications, the Poisson's ratio to generate a lateral deformation as a response to compression between conductive electrodes. Deformation of the electroactive polymer may be used to actuate optical elements in an optical assembly, such as a lens system.

Notwithstanding recent developments, it would be advantageous to provide polymer or other dielectric materials having improved characteristics, including a controllable deformation response and/or a tunable refractive index.

SUMMARY

As will be described in greater detail below, the instant disclosure relates to methods for forming ordered and disordered nanovoided composite materials, including nanovoided composite polymers.

According to certain embodiments, a method of forming a nanovoided composite polymer includes forming a resin-containing layer over a substrate, the resin-containing layer including a polymer-forming phase and a sacrificial phase, curing the polymer-forming phase to form a polymer matrix containing the sacrificial phase, and removing the sacrificial phase selectively with respect to the polymer matrix to form a nanovoided composite polymer including the polymer matrix and nanovoids dispersed throughout the polymer matrix.

By way of example, the resin-containing layer may be formed from a mixture containing the polymer-forming phase and the sacrificial phase. In some embodiments, the sacrificial phase may be randomly dispersed throughout the polymer-forming phase. In some embodiments, the sacrificial phase may be formed after forming the resin-containing layer on the substrate. In accordance with certain embodiments, the sacrificial phase may include a polymerizable phase.

In certain embodiments, the polymer-forming phase may be cured by exposure to radiation. For instance, in some embodiments the method may include forming a mask, e.g., a phase-shift mask, over the resin-containing layer to block portions of the resin-containing layer. The polymer matrix may be formed by exposing portions of the resin-containing layer unblocked by the mask to radiation.

In example nanovoided composite polymers, the nanovoids may be randomly dispersed throughout the polymer matrix. In further example nanovoided composite polymers, the nanovoids may be dispersed throughout the polymer matrix with a periodic structure having a repeat distance in at least one dimension of approximately 20 nm to approximately 1000 nm.

In some embodiments, a method of removing the sacrificial phase may include at least one of dissolution, sublimation, decomposition or melting. In particular embodiments, removing the sacrificial phase may include exposing the sacrificial phase to an increasingly non-polar solvent.

Following removal of the sacrificial phase, in some embodiments, the polymer matrix may be partially de-crosslinked. In some embodiments, the mechanical integrity of the nanovoided composite polymer may be improved by forming a coating of a material having a Young's modulus of at least 10 GPa over at least a portion of an inner surface of the nanovoids.

According to certain methods, a further method of forming a nanovoided composite polymer includes locally depositing a polymer-forming phase over a substrate to form a discontinuous layer of the polymer-forming phase and nanovoids disposed between regions of the locally-deposited polymer-forming phase and curing the polymer-forming phase to form a nanovoided composite polymer including a polymer matrix and nanovoids dispersed throughout the polymer matrix. By way of example, locally depositing the polymer-forming phase may include extrusion, ink-jet printing, electrohydrodynamic printing, contact printing, transfer printing, mask printing, or air-brushing. In some embodiments, the nanovoids may occupy at least approximately 10% by volume of the polymer matrix.

Also disclosed is a polymer composition that includes a polymer matrix and a plurality of nanovoids regularly dispersed throughout the polymer matrix. The nanovoids may exhibit a periodic structure, e.g., having a repeat distance in at least one dimension of approximately 20 nm to approximately 1000 nm.

Features from any of the these or other embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 9A depicts the formation of a primary resin layer over a substrate according to some embodiments.

FIG. 9B shows patterning of the primary resin layer of FIG. 9A according to some embodiments.

FIG. 9C shows the deposition of a sacrificial layer within openings defined by the patterned primary resin layer of FIG. 9B according to some embodiments.

FIG. 9D depicts the formation of a secondary resin layer over the structure of FIG. 9C according to various embodiments.

FIG. 9E shows the removal of the sacrificial layer to form a nanovoided composite polymer layer according to some embodiments.

FIG. 10A shows the formation of a one-dimensional grating over a blanket resin layer according to certain embodiments.

FIG. 10B shows the formation of a two-dimensional grating over a blanket resin layer according to certain embodiments.

Figure 1:
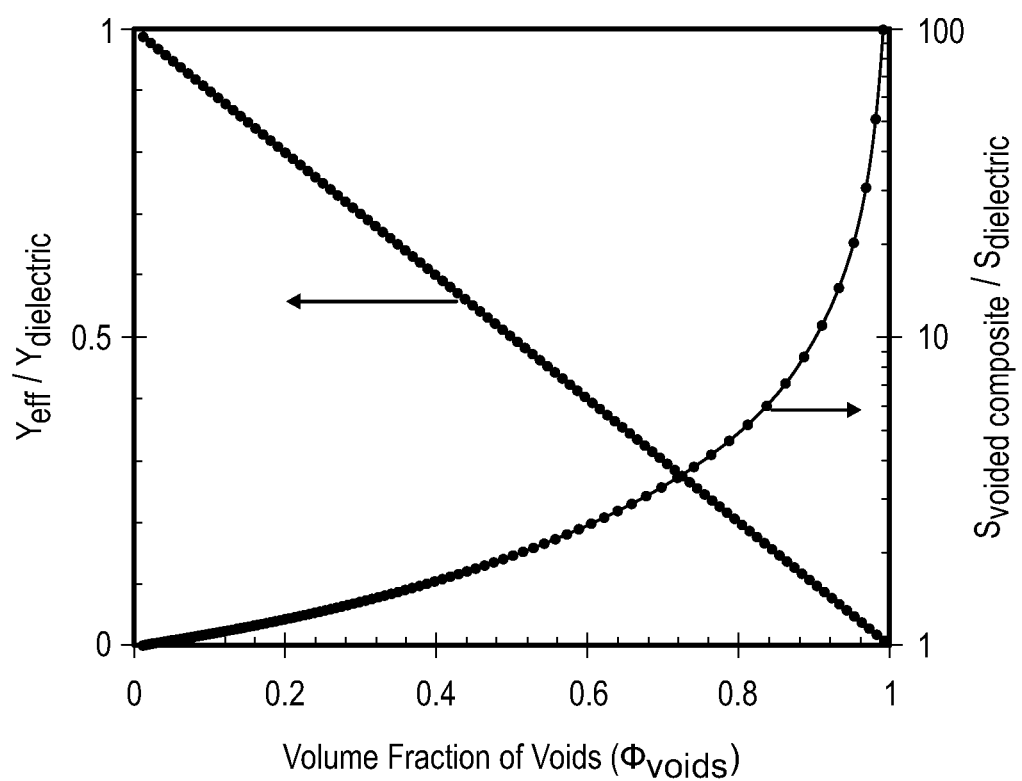
FIG. 1 is a plot showing the effect of void fraction on the Young's modulus and the actuation strain for a composite polymer material according to certain embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to composite polymer materials and more particularly to methods for forming nanovoided polymer thin film materials having ordered or disordered arrays of nanovoids.

As will be explained in greater detail below, embodiments of the instant disclosure relate to a method that includes forming a resin-containing layer over a substrate, the resin-containing layer including a polymer-forming phase and a sacrificial phase, curing the polymer-forming phase to form a polymer matrix containing the sacrificial phase, and removing the sacrificial phase selectively with respect to the polymer matrix to form a nanovoided composite polymer including the polymer matrix and nanovoids dispersed throughout the polymer matrix.

In accordance with various embodiments, a nanovoided polymer material may include an electroactive polymer matrix and a plurality of nanoscale voids dispersed throughout the matrix. The voids may be randomly or regularly dispersed throughout the electroactive polymer.

An electroactive polymer may include a deformable polymer that may be symmetric with regard to electrical charge (e.g., polydimethylsiloxane (PDMS) acrylates, etc.) or asymmetric (e.g., poled polyvinylidene fluoride (PVDF) or its co-polymers such as poly(vinylidenefluoride-co-trifluoroethylene) (PVDF-TrFE)). Additional examples of polymer materials forming electroactive polymers may include, without limitation, styrenes, polyesters, polycarbonates, epoxies, halogenated polymers, silicone polymers, and/or other suitable polymer materials. Such materials, according to some embodiments, may have a dielectric constant or relative permittivity, such as, for example, a dielectric constant ranging from approximately 1.2 to approximately 30.

In the presence of an electrostatic field (E-field), an electroactive polymer may deform (e.g., compress, elongate, bend, etc.) according to the magnitude and direction of the applied field. Generation of such a field may be accomplished, for example, by placing the electroactive polymer between two electrodes, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

The physical origin of the deformable nature of electroactive polymers in the presence of an electrostatic field, being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance, in this case, is the change of strain with respect to stress or, equivalently, in more practical terms, the change in displacement with respect to force.

Without wishing to be bound by theory, in an idealized device including a linearly elastic polymer exhibiting no pull-in effects, the actuation strain (s) is proportional to the permittivity ($\varepsilon_r$) of the polymer and the square of applied voltage (V), while being inversely proportional to the Young's modulus (Y) of the polymer and the square of the distance (d) between the electrodes. These relationships may be summarized as $$s = \frac{\varepsilon_0 \varepsilon_r}{Y}\left(\frac{V}{d}\right)^2,$$

where $\varepsilon_0$ is the permittivity of free space.

By approximating the electric field within the polymer as the ratio of voltage (V) to the distance (d) between electrodes, the maximum actuation strain ($s_{max}$) may be represented as $$s_{max} = \frac{\varepsilon_0 \varepsilon_r}{Y}(E_s)^2.$$

At large voltages, the electric field within the polymer may exceed its dielectric strength ($E_s$) resulting in device failure. Thus, while other considerations remain, approaches for manufacturing an actuator capable of a large deformation at a moderate operating voltage and exhibiting a higher energy density may include decreasing the effective Young's modulus (Y) and/or increasing the permittivity ($\varepsilon_r$) of the electroactive polymer.

In view of the foregoing, some electroactive polymers may have limited application due to a low breakdown voltage with respect to the operating voltage used by electroactive devices (e.g., actuators) that incorporate the polymers. Furthermore, in many electroactive devices, dielectric breakdown of the polymer at high operating voltages may inhibit the realization of appreciable actuation amplitudes, i.e., actuation strain. Accordingly, electroactive devices with reduced operating voltages and higher energy densities may be useful for many applications.

According to various embodiments, the incorporation of nanovoids into the polymer material may improve its electrostatic behavior, particularly at lower applied voltages. As used herein, the terminology "nanovoids," "nanoscale voids," "nanovoided," and the like, refers to voids having at least one sub-micron dimension, i.e., a length and/or width and/or depth, of less than 1000 nm. In example nanovoided polymers, the nanovoids may be randomly distributed throughout the polymer matrix, i.e., without exhibiting any long-range order, or the nanovoids may exhibit a regular, periodic structure in at least one dimension having a repeat distance in at least one dimension of approximately 20 nm to approximately 1000 nm, e.g., approximately 20 nm, approximately 30 nm, approximately 40 nm, approximately 50 nm, approximately 100 nm, approximately 150 nm, approximately 200 nm, approximately 300 nm, approximately 400 nm, approximately 500 nm, or approximately 1000 nm, including ranges between any of the foregoing values. In both disordered and ordered structures, the nanovoids may be discrete, closed-celled voids or open-celled voids that may be at least partially interconnected.

Figure 11:
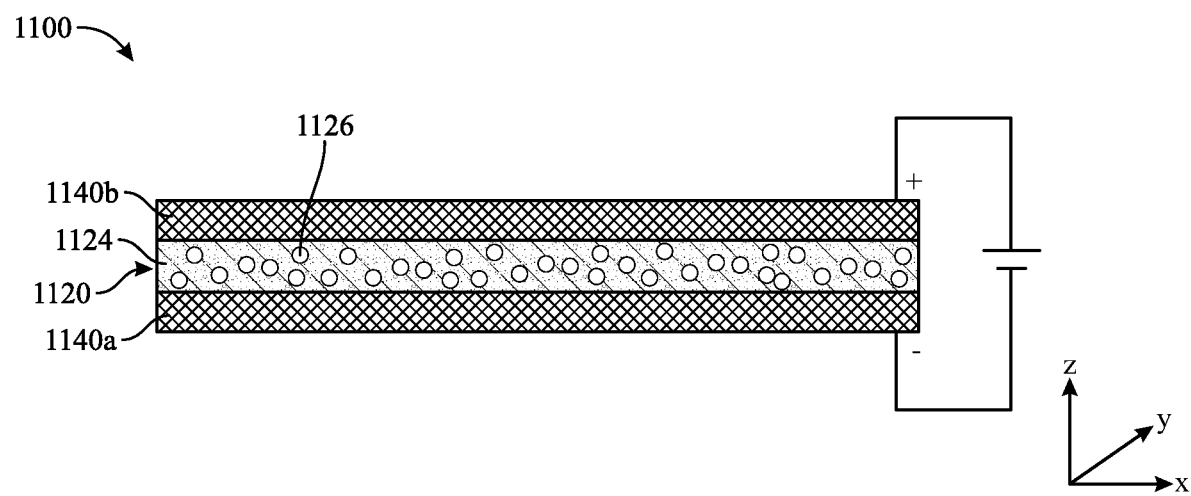
FIG. 11 shows a cross-sectional view of an electroactive device including a nanovoided polymeric thin film in accordance with one or more embodiments of the disclosure.
Figure 12:
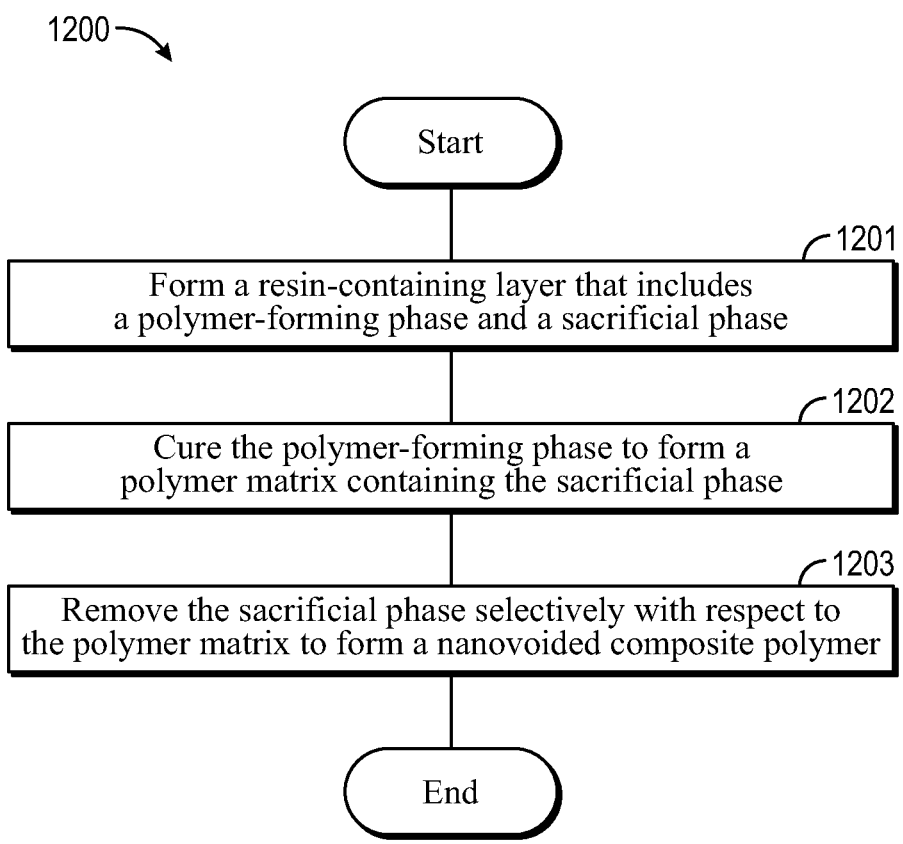
FIG. 12 is flow diagram of an example method of manufacturing a nanovoided composite polymer.

The following will provide, with reference to FIGS. 1-12, a detailed description of methods, systems and apparatuses for forming ordered or disordered nanovoided polymer materials. The discussion associated with FIG. 1 includes a description of the effect of nanovoids on the mechanical properties of a polymer thin film. The discussion associated with FIGS. 2A-10B describes various methods for forming ordered or disordered nanovoided composite polymers. The discussion associated with FIG. 11 includes a description of an example device including a nanovoided polymer thin film disposed between electrodes according to some embodiments. The discussion associated with FIG. 12 summarizes an example method of manufacturing a nanovoided composite polymer according to certain embodiments.

In view of the foregoing, and in accordance with various embodiments, the incorporation of nanovoids into the polymer matrix may beneficially impact the deformation response to an applied load. For instance, the effective modulus ($Y_{eff}$) for a nanovoided polymer material, where the modulus of the material within the voids (e.g., air) is much less than the modulus of the polymer matrix ($Y_{void} \ll Y_{dielectric}$), can be expressed as $Y_{eff} = Y_{dielectric}(1-\Phi_{void})$, where $\Phi_{void}$ is the volume fraction of voids. As shown in FIG. 1, the effective Young's modulus is proportionally reduced by the volume fraction of voids within the polymer, which in turn increases the actuation amplitude (i.e., actuation strain) of the nanovoided composite.

In some embodiments, the nanovoided composite polymer material may include an elastomeric polymer matrix having an elastic modulus of less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, or approximately 0.05 GPa, including ranges between any of the foregoing values).

Polymer materials (e.g., electroactive polymer materials) including voids having nanoscale dimensions may possess a number of advantageous attributes. For example, nanovoided polymers may exhibit a higher transmission of visible light than their larger voided counterparts. Also, the incorporation of nanovoids into a polymer matrix may increase the permittivity of the resulting composite. Furthermore, the high surface area-to-volume ratio associated with nanovoided polymers may provide a greater interfacial area between the nanovoids and the surrounding polymer matrix. With such a high surface area structure, electric charge can accumulate at the void-matrix interface, which can enable greater polarizability and, consequently, increased permittivity ($E_r$) of the composite. Additionally, because ions, such as plasma electrons, can only be accelerated over small distances within nanovoids, the likelihood of molecular collisions that liberate additional ions and create a breakdown cascade is decreased, which may result in the nanovoided material exhibiting a greater breakdown strength than un-voided or even macro-voided dielectrics. In some embodiments, an ordered nanovoid architecture may provide a controlled deformation response, while a disordered nanovoided structure may provide enhanced resistance to crack propagation and thus improved mechanical durability.

According to various embodiments, nanovoids may be distributed homogeneously or non-homogeneously throughout the nanovoided polymer. By way of example, the size of the voids and/or the void size distribution may vary spatially within the nanovoided polymer material, i.e., laterally and/or with respect to the thickness of the nanovoided polymer material. In a similar vein, a nanovoided polymer thin film may have a constant density of nanovoids or the density of nanovoids may increase or decrease as a function of thickness, for example. Adjusting the void fraction of an EAP, for instance, can be used to tune its compressive stress-strain characteristics.

As disclosed in further detail herein, various manufacturing methods may be used to form nanovoided polymer materials, such as nanovoided polymer thin films having a disordered arrangement of nanovoids or an ordered arrangement of nanovoids. Methods for forming nanovoided polymer thin films having randomly-distributed (i.e., disordered) voids include selectively depositing a polymer composition or a polymeric precursor composition (e.g., resin) to form voids in situ or depositing a polymer or polymeric precursor composition containing a randomly dispersed templating agent and then removing the templating agent. Example methods for forming nanovoided polymer thin films having a regular (i.e., ordered) arrangement of voids according to certain embodiments include self-assembly or various lithography techniques.

Figure 2A:
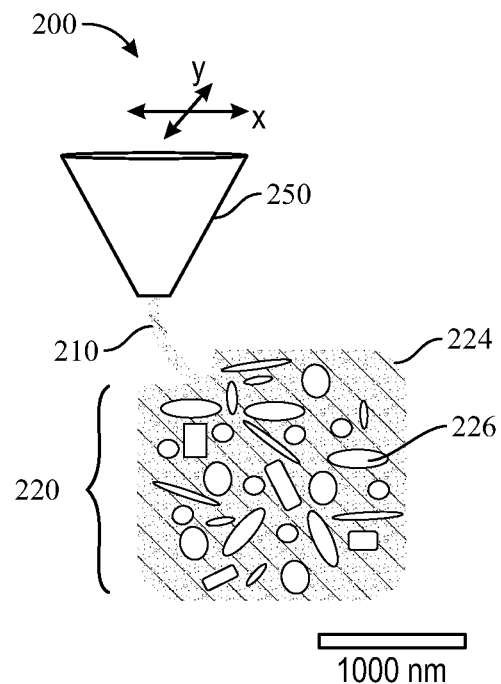
FIG. 2A shows an example selective deposition method for forming a nanovoided composite polymer according to some embodiments.
Figure 2B:
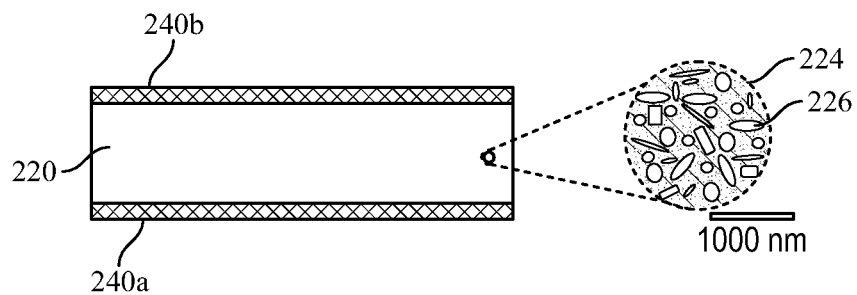
FIG. 2B shows an example structure including a nanovoided composite polymer thin film formed by selective deposition and disposed between opposing electrodes according to some embodiments.

Referring to FIGS. 2A and 2B, according to an example method 200, a polymer composition or a precursor to a polymer composition (e.g., resin) 210 may be selectively dispensed onto a primary electrode 240a (i.e., substrate) and dried, e.g., using a post-deposition bake or a thermal or UV cure, to form a nanovoided composite polymer 220. According to various embodiments, a polymer precursor composition may include a synthetic or natural resin that includes monomeric or oligomeric precursors to thermoplastic or elastomeric materials. In the illustrated embodiment, the polymer composition or polymer precursor composition 210 may be locally dispensed by extrusion, e.g., through a nozzle 250.

In some embodiments, the nozzle 250 may be adapted to translate with respect to a major surface of a substrate, i.e., in x- and/or y-directions. Furthermore, the translation rate and position and the flow rate of the polymer composition or the polymer precursor composition 210 through the nozzle 250 may be independently controlled, which enables a polymer matrix 224 to be selective formed over localized regions of the primary electrode 240a, i.e., to the exclusion of voided regions 226 where no deposition occurs.

As illustrated in FIG. 2B, a secondary electrode 240b may be formed over the nanovoided composite polymer 220. According to various embodiments, a layer of the nanovoided composite polymer 220 may be formed directly over a suitable electrode, or an electrode may be deposited on or otherwise affixed to the nanovoided composite polymer 220.

In some embodiments, the electrodes (e.g., the primary electrode 240a and the secondary electrode 240b) may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

In some configurations, the electrodes may be configured to stretch elastically. In such embodiments, the electrodes may include TCOs, graphene, carbon nanotubes, and the like. In other embodiments, relatively rigid electrodes (e.g., electrodes including a metal such as aluminum) may be used.

In some embodiments, the electrodes (e.g., the primary electrode 240a and the secondary electrode 240b) may have a thickness of approximately 1 nm to approximately 1000 nm, with an example thickness of approximately 10 nm to approximately 50 nm. Some of the electrodes 240a, 240b may be designed to allow healing of electrical breakdown (e.g., associated with the electric breakdown of elastomeric polymer materials). A thickness of an electrode that includes a self-healing electrode (e.g., an aluminum electrode) may be approximately 20 nm.

In some embodiments, the electrodes (e.g., the primary electrode 240a and the secondary electrode 240b) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In another aspect, the electrodes may be manufactured using a thermal evaporator, a sputtering system, a spray coater, a spin-coater, and the like.

With reference again to FIG. 2A, although the illustrated embodiment relates to the selective deposition of a polymer material or a polymer precursor material by extrusion, according to further embodiments, the polymer composition or polymer precursor composition 210 may be selectively deposited by other methods, such as ink-jet printing, electrohydrodynamic printing, contact printing, transfer printing, mask printing, or air-brushing. According to still further embodiments, deposition may occur through actinic radiation of a liquid bath of polymer precursors, such as with holographic printing, stereolithographic printing, two-photon polymerization, nanoscribe writing, or other additive manufacturing methods adapted to form micron and/or sub-micron features, as known to those skilled in the art.

The nanovoided polymer may be formed in situ or after deposition of precursors in response to thermal treatment or exposure to ambient or controlled atmosphere. In some embodiments, the polymer composition or polymer precursor composition 210 may be co-deposited with other materials that provide mechanical support during formation of the nanovoided composite polymer. Example materials that may provide mechanical support include mineral fillers such as silica and/or various silicates.

Figure 3A:
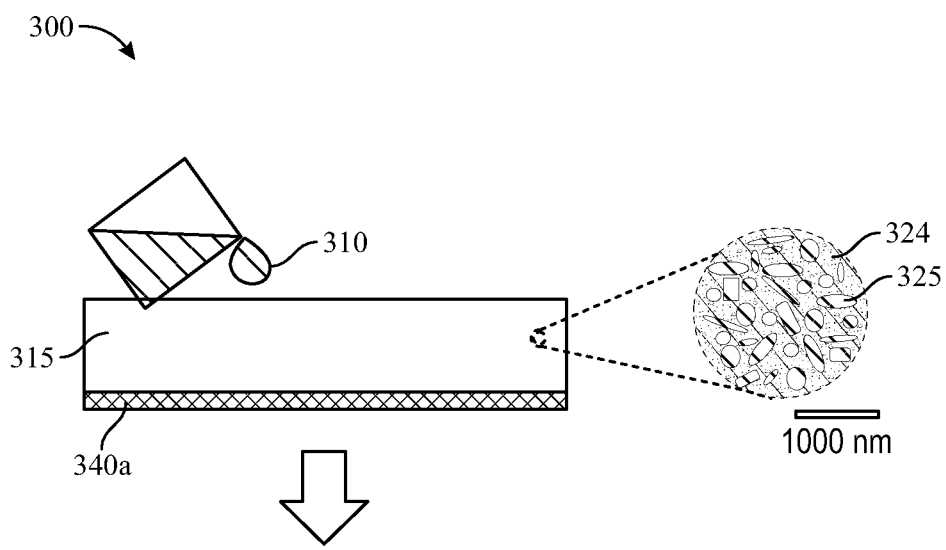
FIG. 3A depicts the formation of a templated composite polymer layer on an electrode according to various embodiments.

Turning to FIG. 3A, in a further example method, a templating agent may be used to define nanovoids within a nanovoided polymer. Method 300 may include dispensing a mixture 310 that includes a templating agent and a polymer composition and/or a precursor to a polymer composition (e.g., resin) onto a primary electrode 340a to form a templated composite polymer layer 315. The templated composite polymer layer 315 includes a matrix 324 and a templating agent 325 randomly dispersed throughout the matrix 224. The mixture 310 may further include a solvent.

According to certain embodiments, the mixture 310 may be deposited directly onto a suitable electrode and/or an electrode may be formed over or otherwise affixed to the templated composite polymer layer 315. The mixture 310 may be deposited by dip-coating, spin-coating, air-brushing, spray-coating, ink-jet printing, electrohydrodynamic printing, extrusion, soft lithography, replica molding, 3D printing, or other material deposition methods.

As used herein, a "templating agent" refers to a material that is adapted to direct the structural formation of another material. For instance, a templating agent 325 may be used to generate nanovoids within a layer of polymeric material. Suitable templating agents include solids, liquids, or gases that may be selectively removed from the polymer matrix to produce nanovoids therein.

According to some embodiments, a templating agent may include a porogen. Example porogen molecules include hydrocarbons having a double bond, including, but not limited to propene, butene, pentene, hexene, heptene, as well as cyclic forms thereof.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch or dissolution step may include an etch chemistry or dissolution chemistry that removes a first material selectively to a second material by a ratio of 2:1 or greater, e.g., 5:1, 10:1 or 20:1, although greater selectivity ratios are contemplated.

In some embodiments, a method of forming a nanovoided composite polymer thin film includes the co-deposition of a mixture containing two or more phases, i.e., a polymer or polymer precursor and a porogen. For example, a spraying technique such as electric field assisted spraying, which is capable of forming nano-droplets of a porogen, can be used to co-deposit the polymer and the porogen phases. In an alternate example, a method of forming a nanovoided composite polymer thin film includes depositing alternating layers of polymer and porogen.

With reference again to FIG. 3A, the as-deposited layer(s) may be cured or treated using, for example, thermal energy, UV light, electron beam irradiation, chemical energy, or combinations thereof, to form a polymer thin film on the primary electrode 340a. By way of example, the as-deposited material may be cured at a temperature of approximately 250° C. to approximately 400° C. using a pulsed or continuous UV source at a UV wavelength of approximately 150 to approximately 400 nm.

Figure 3B:
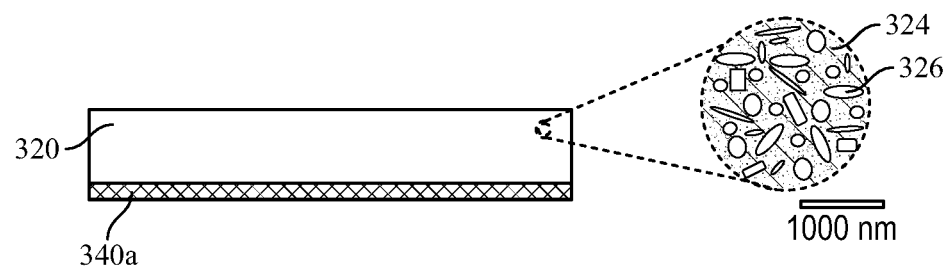
FIG. 3B shows the selective removal of the templating agent from the templated composite polymer layer of FIG. 3A and the attendant formation of a nanovoided composite polymer thin film according to certain embodiments.

Referring to FIG. 3B, following the formation and optional curing of the templated composite polymer layer 315 the templating agent 325 may be removed selectively with respect to the polymer matrix 324 to form a nanovoided composite polymer 320 having a plurality of nanovoids 326 randomly dispersed throughout polymer matrix 324.

The templating agent may be removed by one or more of dissolution, sublimation, decomposition or melting. In certain embodiments, the templating agent is at least partially removed. In certain embodiments, the templating agent is completely removed. As will be understood, the nanovoids 326 may occupy regions within the polymer matrix 324 previously filled with the templating agent 325.

By way of example, templating agents such as porogens may be removed using a post-deposition energy treatment that is applied using, for example, thermal, UV light, e-beam, or other energy sources. During this treatment, the templating agent is evolved from the as-deposited or cured thin film leaving the voided polymer matrix 324. Thus, the templating agent may be a sacrificial material used to create the nanometer scale void structure.

In some embodiments, the morphology of the templating agent 325 may directly control the morphology of the resulting nanovoids 326, such as with a solid templating agent where the dimension(s) of the voids 326 correspond to the dimension(s) of the templating agent 325. An example of dimensional fidelity between the templating agent 325 and the subsequently-formed voids 326 is illustrated schematically in FIGS. 3A and 3B. On the other hand, according to some embodiments, the nanovoids 326 may occupy a volume that is greater than and/or not congruous with the volume of templating agent.

In certain embodiments, the templating agent 325 may create nanovoids 326 by concentrating stress fields (not shown) within the polymer matrix 324 proximate to the templating agent 325. The stress may generate nanovoids in the polymer when the polymer material is strained. Alternatively, the nanovoids 326 may be produced by cavitation of the polymer material layer during or after its formation.

In certain embodiments, the disordered nanovoids 326 may occupy at least approximately 10% by volume of the polymer matrix, e.g., from approximately 10% to approximately 90% by volume of the polymer matrix.

Figure 4A:
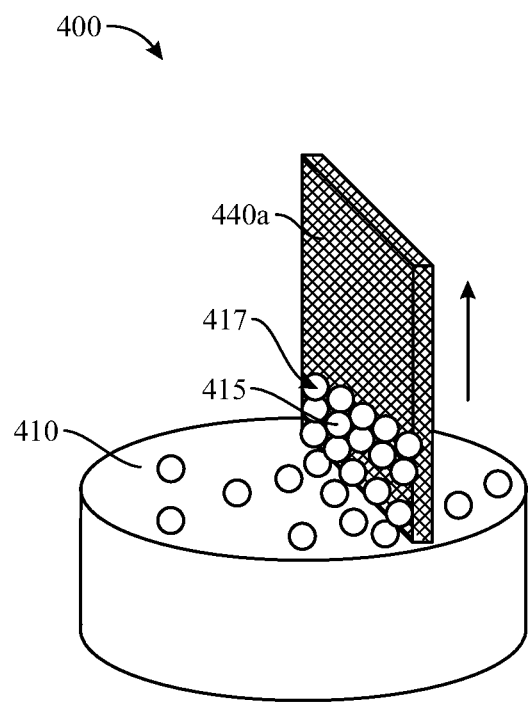
FIG. 4A is a schematic diagram showing the formation by self-assembly of a nanovoided composite polymer layer having an ordered void structure according to some embodiments.
Figure 4B:
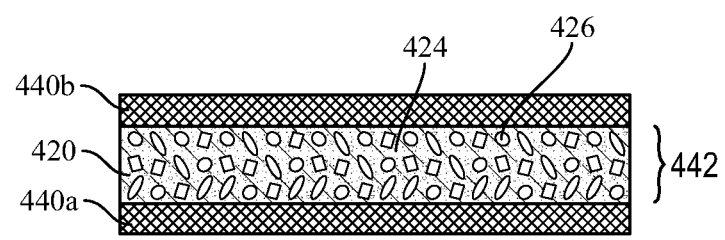
FIG. 4B depicts a structure following the formation of a secondary electrode over a composite polymer layer according to various embodiments.

According to still further embodiments, and with reference to FIG. 4A and FIG. 4B, a nanovoided composite polymer material may include a polymer matrix having regular, periodic array of nanovoids. In some embodiments, the nanovoided composite polymer material may be formed by self-assembly.

Referring to FIG. 4A, an example method 400 for forming a nanovoided composite polymer having a structured void array includes evaporation-induced, self-assembly. In the illustrated method 400, a primary substrate 440a is dipped into and withdrawn from a reservoir containing a mixture 410 of nanoparticles, resin, and solvent (not separately shown) to form a resin thin film 415 of colloidal particles 417 containing the nanoparticles and the resin. Although a dip-coating method is illustrated, other methods of forming the thin film 415 include spin-coating, blade coating, or inkjet printing. The deposited thin film 415 may be dried, e.g., using a post-application bake or a thermal or UV cure.

According to some embodiments, the nanoparticles may include organic or inorganic compositions. For instance, metallic nanoparticles may include elemental metals or metal alloys, such as iron (Fe), cobalt (Co), nickel (Ni), copper (Cu), palladium (Pd), silver (Ag), platinum (Pt), gold (Au), FeCo, FePt or NiPt.

Example resins may include monomeric or oligomeric precursors to thermoplastic materials such as polyvinyl, polystyrene, polycarbonate, polyacrylate, or polyethylene, as well as thermosetting materials such as polyesters, epoxies such as siloxane-modified epoxy resins, or silicones.

In accordance with various embodiments, example solvents include water, xylene, anisole, decalin, cyclohexane, cyclohexene, methylcyclohexane, ethylcyclohexane, ethyl acetate, heptane, hexane, octane, nonane, decane, dodecane, dimethyl formamide, mixtures of C8-C11 alkanes, or mixtures of C8-C11 aromatic hydrocarbons, as well as combinations thereof. Further example solvents include alcohols, such as methanol, ethanol, 1-propanol, 2-propanol, 1-butanol, or 2-butanol.

Self-assembly may accompany removal of the solvent, such as by evaporation, e.g., during withdrawal of the coated primary substrate 440a from the mixture 410. In some embodiments, the solvent may be removed by evaporation at reduced pressure. In some embodiments, the solvent may be removed by freeze-drying.

The thickness of the resin thin film 415 can be controlled by the withdrawal rate, which may range from approximately 1 cm/min to approximately 1 mm/sec, although slower and faster withdrawal rates may be used. After the primary substrate 440a is fully withdrawn, the resin can be cured to form a stable polymer thin film enveloping the assembled nanoparticles. For example, the resin may be cured by heating the coated primary substrate 440a or by exposure to radiation, e.g., ultraviolet radiation, or any other suitable actinic radiation. As will be appreciated, in accordance with various embodiments, the ordered, self-assembled nanoparticles may act as sacrificial templating material, which may be removed in a subsequent processing step.

In various embodiments, the sacrificial templating material (i.e., nanoparticles) may be removed after self-assembly by partially or fully decomposing the templating material and removing it from the surrounding polymer matrix to form a nanovoided composite thin film 420, as shown in FIG. 4B. Selective decomposition techniques include thermal degradation, chemical degradation, physical degradation, or combinations thereof. Selective removal techniques include, but are not limited to, development in a selective solvent or evaporation under reduced pressure.

Solvents used to remove the templating material (i.e., nanoparticles) may be chosen such that the polymer resin does not appreciably swell during development. For example, the amount of swelling of the resin during removal of the templating material may be approximately 10% or less, e.g., less than approximately 10%, less than approximately 5%, less than approximately 2%, less than approximately 1%, or less than approximately 0.5%, including ranges between any of the foregoing values. In some embodiments, the templating material is removed by developing in a solvent composition, e.g., using a solvent bath. In some embodiments, the templating material is removed by developing in a solvent composition, where during the act of developing the composition of the solvent bath may be gradually changed to an increasingly non-polar, lower surface energy solvent by solvent exchange. Such a process of solvent exchange may decrease the propensity for collapse of the voided polymer matrix during drying due to capillary forces.

In certain embodiments, removal of the templating material with one or more developing solvents may be conducted at temperature less than the glass transition temperature ($T_g$) of the resin or polymer, which may inhibit collapse of the voided polymer matrix. By way of example, removal of the templating material with the one or more solvents may be conducted at a temperature of approximately −76° C. to approximately 10° C. In certain embodiments, the developing solvent may include a supercritical fluid such as supercritical carbon dioxide.

According to further embodiments, in lieu of incorporating discrete nanoparticles into the mixture 410, the mixture 410 may include a block co-polymer, a bottlebrush polymer, or any other material capable of forming periodic domains of two or more polymers, such that the mixture 410 contains a matrix-forming material and a sacrificial, void-forming material. That is, the block co-polymer may include a first portion as a polymer-forming phase and a second portion as a sacrificial phase. In some embodiments, the sacrificial phase may include a polymer-forming phase.

Self-assembly of block co-polymer materials, for example, can be driven by thermal energy, solvent vapor treatment, electric fields, shear energy, as well as combinations thereof. The sacrificial material is designed to undergo either partial or full decomposition to enable its selective removal from the matrix material and the attendant formation of a nanovoided structure. With such a method, the size and periodicity of the domains, and hence the size and periodicity of the nanovoids, may independently range from approximately 10 nm to approximately 500 nm.

Shown in FIG. 4B, according to some embodiments, is an actuator architecture including, from bottom to top, a primary electrode 440a, a nanovoided composite polymer thin film 420 disposed directly over the primary electrode 440a, and a secondary electrode 440b disposed directly over the composite polymer thin film 420. The composite polymer thin film 420 may include a polymer matrix 424 and an ordered array of nanovoids 426 distributed throughout the matrix 424. In certain embodiments, the ordered nanovoids 426 may occupy at least approximately 10% by volume of the polymer matrix, e.g., from approximately 10% to approximately 90% by volume of the polymer matrix and may have a periodic structure. In some embodiments, the nanovoids, which may be closed-celled or open-celled, may have a periodic structure with a repeat distance in at least one dimension (e.g., x-, y-, and/or z-dimension) of approximately 20 nm to approximately 1000 nm.

The composite polymer thin film 420 may be formed by self-assembly over (e.g., directly over) a primary electrode 440a, and the secondary electrode 440b may be formed over (e.g., directly over) the composite polymer thin film 420. Alternatively, the composite polymer thin film 420 may be injected or extruded into a gap 442 between the primary and second electrodes 440a, 440b. As will be appreciated, removal of a portion of the self-assembled material to create the nanovoids 426 can be performed before or after formation of the secondary electrode 440b.

In some embodiments, the polymer matrix 424 can be configured such that during self-assembly, the matrix-forming material has a high modulus (>10 GPa) or $T_g$ greater than 20° C., such that the matrix-forming material is sufficiently mechanically robust that the propensity for void collapse is decreased or void collapse is avoided. After the nanovoided structure is developed, the matrix-forming material (i.e., polymer) may be partially de-crosslinked, which may decrease the modulus of the matrix polymer. For instance, the resin may be composed of a mixture of difunctional acrylate monomers, where a fraction of the difunctional monomers contain acid-labile bonds (i.e., acetal bonds). In a post-development step, the nanovoided film may be exposed to a UV flood cure, which may activate a photoacid generator and degrade the acetal-containing diacrylate. The impact of the flood cure may cause a net decrease in crosslink density, lowering the modulus of the thin film 420 to less than 10 GPa, for example.

According to further embodiments, a nanovoided composite polymer having an ordered, e.g., periodic, arrangement of voids may be formed using photolithography. Patterning of a resin thin film may be performed in a single exposure/developing sequence or using multiple exposure and developing steps, e.g., using a focused energy beam or blanket exposure in conjunction with a photomask. Example lithography techniques include optical, electron beam, imprint, or other patterning techniques capable of resolving features on the order of approximately 20 to approximately 1000 nm.

By way of example, according to some embodiments, successive layers of a resin thin film may be patterned and developed to form a periodic voided structure using multiple lithography sequences such that the final thickness of the nanovoided composite polymer is greater than the thickness patterned in a single step.

According to some embodiments, the photomask may be a binary mask or a phase-shift mask. Such a mask may be disposed over a photosensitive resin, e.g., in direct contact or in close proximity to the resin thin film. In conjunction with subsequent exposure and developing steps, exposed regions of the resin, i.e., regions of the resin unblocked by the photomask, may be polymerized, and unexposed regions may then be selectively removed to form voided regions within the polymer matrix.

Direct write lithography and interferometric lithography techniques, for instance, may be used to create periodic volumetric structures in photosensitive materials in a single step. Other lithography techniques, such as layered imprint lithography, can be used to create a three-dimensional voided structure using multiple patterning steps. In such techniques, following deposition of a thin film of photosensitive material, a portion of the photosensitive material is removed by selective development to produce a nanovoided thin film. The voided architecture, including void size, void size distribution, and spacing can be controlled by the processing conditions used in the patterning step(s). In certain embodiments, a method includes depositing a photosensitive resin to form a resin thin film, patterning the thin film by exposing a portion of the thin film to a source of radiation, and removing un-exposed portions of the resin to form nanovoided regions without collapsing the nanovoided polymer matrix.

Figure 5:
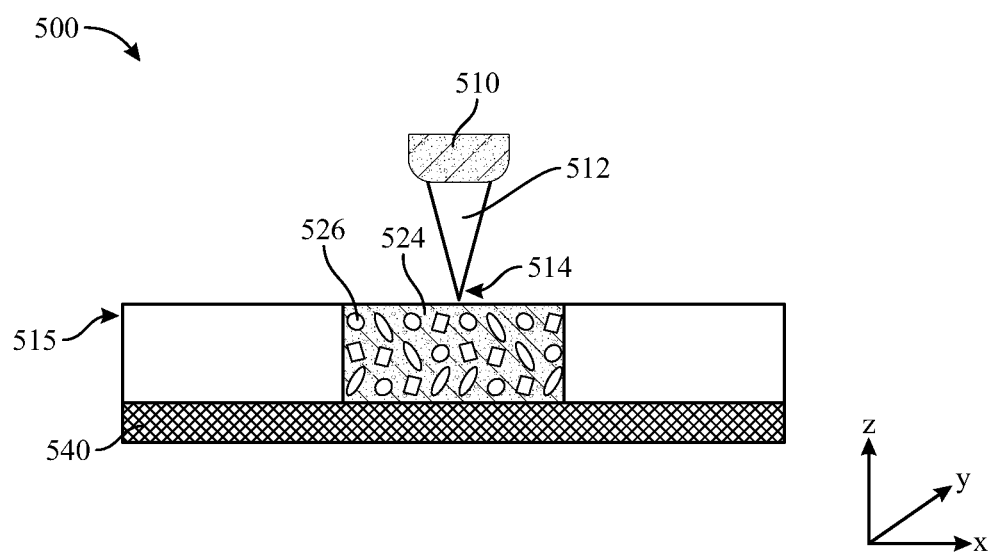
FIG. 5 is a schematic diagram illustrating a direct write lithography process for forming a nanovoided composite polymer according to some embodiments.

With reference to FIG. 5, illustrated is a direct write lithography method for forming a nanovoided composite polymer thin film. The method 500 includes forming a resin layer 515 over a substrate 540, and locally exposing a portion of the resin layer 515 using radiation emitted from radiation source 510 to form a nanovoided composite polymer layer 520.

The resin layer 515 may be formed by dip-coating, spin-coating, air-brushing, spray-coating, doctor-blading, ink-jet printing, electrohydrodynamic printing, extrusion, soft lithography, replica molding, 3D printing, or other material deposition method suitable for depositing a liquid resin composition.

The resin composition may include one or more polymerizable functional groups, such as acrylates, epoxides, vinyl ethers, thiol-ene moieties, thiol-isocyanate moieties, etc. The resin composition may also contain a photocatalyst and optionally a photosensitizer such that the resin photopolymerizes when exposed to radiation from a direct write beam 512 emitted from the radiation source 510. At the focal point 514 of beam 512, polymerization occurs within a localized volume of the resin layer 515, i.e., to the exclusion of un-exposed regions.

Unexposed, i.e., unpolymerized, resin may be removed selectively with respect to polymerized resin to form nanovoids within the polymer matrix. For instance, unpolymerized resin may be removed by solvent exposure or by evaporation, e.g., under reduced pressure. In some embodiments, a solvent may be removed by freeze-drying.

In some embodiments, the resolution of direct write lithography patterning is approximately 300 nm to approximately 400 nm, which may enable the formation of features (i.e., voids) having dimensions of approximately 150 nm to approximately 200 nm. In certain embodiments, the process illustrated in FIG. 5 can be continued until the desired volume of the resin layer 515 is patterned. In some embodiments, a hard mask or photomask (not shown) can be formed over the resin layer 515, which can be used to define the exposed area of the resin layer 515. Example direct write lithography techniques include two-photon lithography or dip-pen lithography, which can be used to form, in a single writing step, a nanovoided composite polymer layer 520 including a polymer matrix 524 having a plurality of nanovoids 526 dispersed throughout the matrix.

Figure 6:
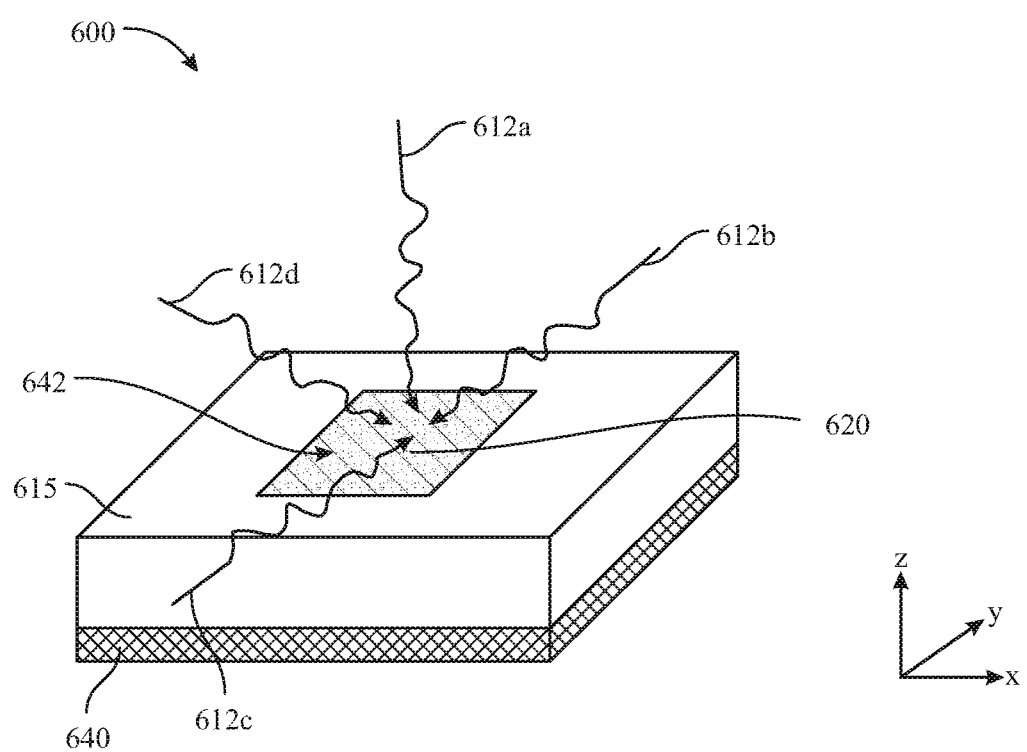
FIG. 6 is a schematic diagram illustrating a method for forming a nanovoided composite polymer by interference lithography according to some embodiments.

According to some embodiments, and with reference to FIG. 6, a further method of forming a nanovoided composite polymer thin film involves interference lithography. The method 600 may include forming a resin layer 615 over a substrate 640 and exposing a portion of the resin layer 615 to radiation from a radiation source (not shown) to form a nanovoided composite polymer layer 620. According to some embodiments, resin layer 615 may be formed using the materials and methods used to form resin layer 515.

As illustrated schematically, the resin layer 615 is exposed to at least three coherent, collimated beams such that the difference in the wave vectors of the beams is non-coplanar. The light source for each of the beams may be a laser whose power is divided between the three or more beams using beam splitters. In the illustrated embodiment, four non-coplanar beams 612a, 612b, 612c, 612d are shown.

Interference between three or more beams gives a pattern that may vary in two-dimensions. In some embodiments, four beams may be used to create a volumetric (three-dimensional) structure. In the region 642 where the three or more beams interfere, an interference pattern is created within the resin layer 615. According to certain embodiments, polymerization occurs in regions of constructive interference. Unexposed, unpolymerized resin may be removed by solvent exposure or by evaporation, e.g., under reduced pressure, to form nanovoids (now shown) within the polymer matrix.

The repeat distance (i.e., lattice constant) of the resulting interference pattern may be controlled by the wavelength of the exposure light and/or the orientation of the beams. For a simple cubic geometry, for example, a 266 nm laser may produce a structure with a periodicity of approximately 230 nm.

A further method for forming a nanovoided composite polymer includes the application of a phase-shift mask and Talbot lithography. Whereas a conventional photomask typically includes a transparent plate of uniform thickness having a patterned layer of opaque material that allows light to pass through and express a defined pattern, phase-shift masks are photomasks that take advantage of the interference generated by phase differences to improve image resolution. Example phase-shift masks include alternating and attenuated phase-shift masks.

In an alternating phase-shift mask, according to some embodiments, certain transmitting regions are made thinner or thicker, which induces a phase shift in the light traveling through those regions of the mask. When the thickness variation is suitably chosen, the interference of the phase-shifted light with the light coming from unmodified regions of the mask may have the effect of improving the contrast on some parts of the projected image, which may ultimately increase the resolution of the image.

In an attenuated phase-shift mask, according to some embodiments, certain light-blocking regions of the mask are modified to allow a small amount of light to be transmitted. Although not sufficient to create a pattern, this transmitted light can interfere with the light passing through the transparent parts of the mask, which can be used to improve image contrast.

Talbot lithography, which is also referred to as displacement Talbot lithography (DTL), is a high-resolution photolithography technique that may be used to produce periodic structures without the need for complex and expensive projection optics. The Talbot effect, which is also referred to as self-imaging or lens-less imaging, relates to a phenomenon manifested by a periodic repetition of planar field distributions in certain types of wave fields. With DTL, by integrating the diffraction field transmitted by a grating mask over the distance of one Talbot period, an effective image that is independent of the distance from the mask can be obtained. In this way, high-resolution periodic patterns can be printed without a depth-of-field limitation.

Figure 7:
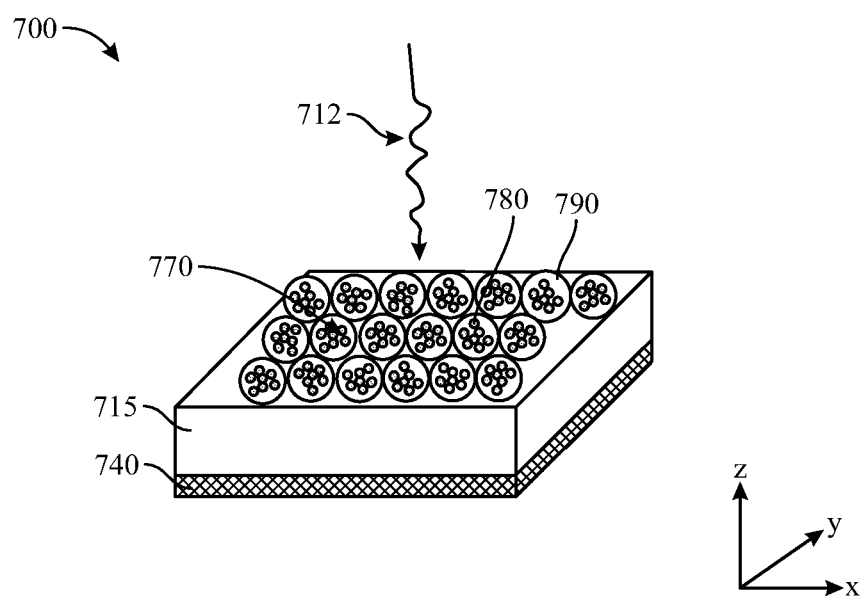
FIG. 7 is a schematic diagram illustrating a method for forming a nanovoided composite polymer using a colloidal phase-shift mask according to certain embodiments.
Figure 8:
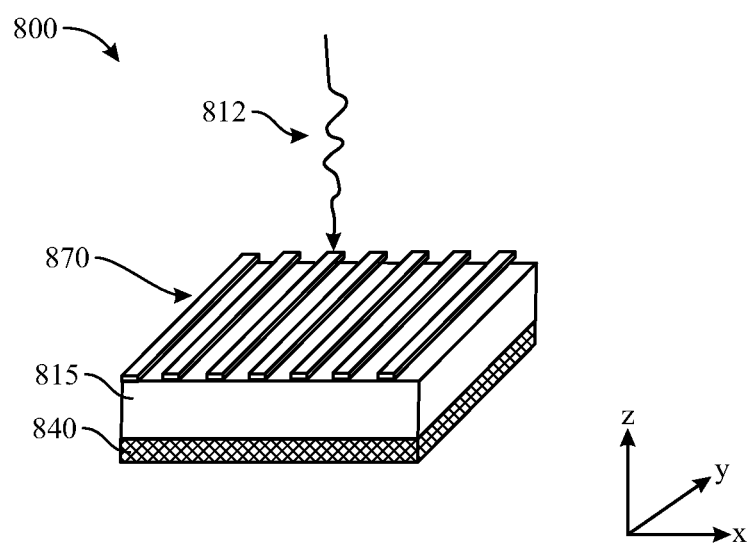
FIG. 8 is a schematic diagram illustrating a method for forming a nanovoided composite polymer using a grated phase-shift mask according to certain embodiments.

Referring to FIG. 7 and FIG. 8, shown schematically are example processes for creating a nanovoided polymer film using a phase-shift mask, optionally in conjunction with Talbot lithography, in a single lithography step. In each respective process, a resin layer 715, 815 is formed over a substrate 740, 840. In connection with certain embodiments, the resin layers 715, 815 may be formed using the materials and methods described herein with respect to resin layer 515 (see FIG. 5), and the substrates 740, 840 may be formed using the materials and methods described with respect to substrates 240a, 240b (see FIGS. 2A and 2B). In certain embodiments, the substrate 740, 840 may include an electrode.

Following drying and solidification of the resin layers 715, 815, e.g., using a post-deposition bake or a thermal or UV cure, a phase-shift mask may be formed over the respective layers. With reference to FIG. 7, for instance, the phase-shift mask 770 may include a plurality of nanoparticles 780 that are arranged as colloidal particles 790 having an average diameter ranging from approximately 50 nm to approximately 2000 nm.

In the embodiment illustrated in FIG. 8, the phase-shift mask 870 may include a 1-dimensional grating defining an alternating line/space pattern. In some embodiments, the grating may have a pitch of approximately 50 nm to approximately 2000 nm. One or more lithography techniques including imprint, projection, contact, or direct write lithography can be used to create phase-shift mask 870.

After forming the phase-shift masks 770, 870, the resin layers 715, 815 may be exposed to a source of radiation including, but not limited to coherent light 712, 812. In some embodiments, in accordance with the Talbot phenomenon, radiation exposure creates a volumetric interference pattern through the thickness of the resin layers 715, 815. In regions of high intensity, where the radiation is unblocked or substantially unattenuated by the respective phase-shift masks 770, 870, the solubility of the resin may be altered. For instance, portions of the resin layers 715, 815 exposed to radiation that passes through the phase-shift masks 770, 870 may be at least partially crosslinked. Crosslinked or partially-crosslinked resin may be less soluble than unexposed resin. Thus, in a subsequent step, the unexposed resin may be removed selectively with respect to the polymerized resin to form a nanovoided composite polymer, where nanovoids occupy regions within the polymer matrix previously occupied by the unexposed resin.

In certain embodiments where a photocure is used to solidify the resin layers prior to the formation of the phase-shift mask, the wavelength of the coherent light used to develop the resin layers may be chosen so as to be sufficiently different from the wavelength used for the photocure that the second exposure to radiation does not induce unwanted or excessive polymerization.

Referring to FIGS. 9A-9E and FIGS. 10A and 10B, shown schematically are example multi-step photolithography methods for creating a nanovoided composite polymer material. As shown in FIG. 9A, according to an example process 900, a blanket primary resin layer 915 is disposed over substrate 940. Primary resin layer 915 may be formed using the materials and methods described above in connection with resin layer 515.

The blanket primary resin layer 915 may be patterned to form a series of primary openings 965, as shown in FIG. 9B. A patterned primary resin layer 915 may be formed by a patterning process such as a photolithographic process, which may include forming a mask layer 916 over the primary resin layer 915. The mask layer 916 may include a layer of photoresist. In some embodiments, the mask layer may then be subjected to a pattern of irradiation, and the exposed photoresist material may be developed using a conventional resist developer. As illustrated in FIG. 9B, the pattern provided by the patterned mask layer 916 is thereafter transferred into the underlying primary resin layer 915 utilizing at least one pattern transfer etching process. Examples of etching processes that may be used to transfer the pattern may include dry etching (e.g., reactive ion etching, plasma etching, or ion beam etching) and/or a chemical wet etch process. According to various embodiments, primary opening 965 may include trenches or vias, for example.

Referring to FIG. 9C, a sacrificial layer 967 may be deposited within the primary openings 965. The sacrificial layer 967 may be self-planarizing or the top surface of the sacrificial layer 967 can be planarized, for example, by chemical mechanical polishing (CMP). Chemical mechanical polishing is a material removal process that uses both chemical reactions and mechanical forces to remove material and planarize a surface. Primary resin layer 915 may serve as a CMP stop layer during planarization of the sacrificial layer 967. The constitution of the sacrificial layer 967 is not particularly limited, although the composition of the sacrificial layer 967 may be chosen to enable its removal selective to the primary resin layer 915.

As shown in FIG. 9D, a secondary resin layer 917 may be formed over the patterned primary resin layer 915 and over the sacrificial layer 967. Secondary resin layer 917 may be formed using the materials and methods described above in connection with resin layer 515. Secondary openings (not shown) may then be formed in the secondary resin layer 917 to expose the sacrificial layer 967.

Following curing of the primary and secondary resin layers 915, 917, as shown in FIG. 9E, the sacrificial layer 967 may be selectively removed, i.e., through secondary openings, to form a nanovoided composite polymer having a plurality of nanovoids 926 arrayed within a polymer matrix. Thus, nanovoids 926 may occupy regions of the structure previously filled with the sacrificial layer 967.

In the embodiment illustrated in FIG. 10A, a method 1000 may include a first lithography step, where a primary phase-shift mask 1070a is formed over resin layer 1015, which is disposed over substrate 1040. As will be appreciated, the materials and methods used to form the resin layer 515 in conjunction with the embodiment of FIG. 5 may be used to form the resin layer 1015 as shown in FIG. 10A.

The primary phase-shift mask 1070a may include a 1-dimensional grating defining an alternating line/space pattern. In some embodiments, the grating may have a pitch of approximately 50 nm to approximately 2000 nm.

Referring to FIG. 10B, in a second lithography step, a secondary phase-shift mask 1070b may be formed over primary phase-shift mask 1070a and over exposed portions of the resin layer 1015. One or more lithography techniques including imprint, projection, contact, or direct write lithography can be used to create phase-shift masks 1070a, 1070b. As illustrated in FIG. 10B, the secondary phase-shift mask 1070b may be arranged substantially orthogonal to the primary phase-shift mask 1070a, although other angular arrangements are contemplated.

After forming the primary and secondary phase-shift masks 1070a, 1070b, the resin layer 1015 may be exposed to a source of radiation including, e.g., coherent light. In some embodiments, radiation exposure creates a volumetric interference pattern through the thickness of the resin layer 1015, such that portions of the resin layer unblocked by the primary and secondary phase-shift masks 1070a, 1070b may be at least partially crosslinked. In some embodiments, the crosslinked or partially-crosslinked resin may be rendered less soluble than unexposed resin. The unexposed, uncrosslinked resin may be removed selectively with respect to the polymerized resin to form a nanovoided composite polymer, where nanovoids occupy regions within the polymer matrix previously occupied by the untreated resin.

In each lithography process disclosed herein, the unpolymerized resin may be removed by development in a selective solvent, e.g., by solvent exposure and evaporation optionally under reduced pressure. The solvent may be chosen such that the polymerized resin does not swell during development.

In some embodiments, the unpolymerized resin may be removed by developing initially in one solvent, where during the course of development the solvent composition is made increasingly non-polar. A solvent exchange process decreases the likelihood of collapse of the polymer matrix during drying due to capillary forces, as non-polar solvents typically have lower surface energies than polar solvents. Sometimes, the developing solvent is a supercritical fluid.

In addition to or in lieu of solvent exchange, according to some embodiments, solvent exposure and removal may be performed at a temperature less than the glass transition temperature ($T_g$) of the polymerized resin, e.g., from approximately −76° C. to approximately 10° C., to decrease the likelihood of feature collapse.

According to some embodiments, in connection with the above-described methods, the resin can be configured to have a high modulus (e.g., greater than 10 GPa) or a $T_g$ greater than 20° C. when photopolymerized, such that feature collapse is minimized or avoided. After the nanovoided structure is developed, the resin may be partially de-crosslinked as described herein, which may decrease the modulus of the nanovoided polymer matrix and increase the effectiveness of actuation.

Additionally, according to some embodiments, the nanovoided polymer matrix may be reinforced by forming a high modulus coating on inner surfaces of the voids. The coating may be formed using a solvent-based process such as a sol-gel method or a vapor-based process such as atomic layer deposition. In certain embodiments, the coating may be formed before or after development of the voids. The coating may have a thickness of up to approximately 20 nm, e.g., approximately 2 nm, approximately 5 nm, approximately 10 nm, approximately 15 nm, or approximately 20 nm, including ranges between any of the foregoing values, and may include a material having a modulus that is greater than the modulus of the polymer matrix. An example coating material may include silicon dioxide. As used herein, a coating material may have a Young's modulus of at least approximately 10 GPa, e.g., approximately 10 GPa, approximately 20 GPa, approximately 30 GPa, approximately 40 GPa, approximately 50 GPa, approximately 60 GPa, approximately 70 GPa, approximately 80 GPa, or approximately 90 GPa, including ranges between any of the foregoing values. Reinforcement using a coating on the void inner walls may increase the mechanical robustness of the voided polymer and thus decrease the propensity for feature collapse.

Nanovoided polymeric thin films formed by any of the foregoing methods can be incorporated into a variety of different devices. An example device, as shown schematically in FIG. 11, is an electroactive device 1100 (e.g., a nanovoided actuator) where an electroactive polymer element 1120 includes a nanovoided polymeric thin film having a polymer matrix 1124 and a plurality of nanovoids 1126 dispersed throughout the polymer matrix 1124. Nanovoids 1126 may be randomly or regularly disposed throughout the polymer matrix 1124.

In the illustrated embodiment, the electroactive element 1120 is disposed between a primary electrode 1140a and a secondary electrode 1140b. According to some embodiments, electroactive device 1100 may include the primary electrode 1140a, the secondary electrode 1140b overlapping at least a portion of the primary electrode 1140a, and the electroactive polymer element 1120 having a nanovoided polymer material disposed between and abutting the primary electrode and the secondary electrode.

The application of a voltage between the primary and secondary electrodes 1140a, 1140b can cause compression of the electroactive nanovoided polymeric thin film in the direction of the applied electric field and an associated expansion or contraction of the electroactive nanovoided polymeric thin film in one or more transverse dimensions.

In some embodiments, the electrodes (e.g., the primary electrode 1140a and the secondary electrode 1140b) may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

In some configurations, the electrodes may be configured to stretch elastically. In such embodiments, the electrodes may include TCOs, graphene, carbon nanotubes, and the like. In other embodiments, for example, embodiments where electroactive devices have electroactive polymer elements including nanovoided electroactive polymer materials, relatively rigid electrodes (e.g. electrodes including a metal such as aluminum) may be used.

In some embodiments, the electrodes (e.g., the primary electrode 1140a and the secondary electrode 1140b) may have a thickness of approximately 1 nm to approximately 1000 nm, with an example thickness of approximately 10 nm to approximately 50 nm. Some of the electrodes (e.g., the primary electrode 1140a or the secondary electrode 1140b) may be designed to allow healing of electrical breakdown (e.g., the electric breakdown of elastomeric polymer materials). In some embodiments, a thickness of an electrode that includes a self-healing electrode (e.g., an aluminum electrode) may be approximately 20 nm.

In some embodiments, the electrodes (e.g., the primary electrode 1140a and the secondary electrode 1140b) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In another aspect, the electrodes may be manufactured using a thermal evaporator, a sputtering system, a spray coater, a spin-coater, an ALD unit, and the like.

The methods and systems shown and described herein may be used to form electroactive devices having a single layer or multiple layers of a nanovoided electroactive polymer (e.g., a few layers to tens, hundreds, or thousands of stacked layers). For example, an electroactive device may include a stack of from two electroactive polymer elements and corresponding electrodes to thousands of electroactive polymer elements (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive polymer elements, including ranges between any of the foregoing values). A large number of layers may be used to achieve a high displacement output, where the overall device displacement may be expressed as the sum of the displacement of each layer. Additionally, each of a plurality of electrode/electroactive polymer element/electrode stacks can be independently configured to have a desired void size and void size distribution, as well as shape, alignment, and spacing between layers. Such complex arrangements can enable compression, extension, twisting, and/or bending when operating the electroactive device.

In some embodiments, the electroactive polymer element 1120 may have a thickness of approximately 10 nm to approximately 100 µm (e.g., approximately 10 nm, approximately 20 nm, approximately 50 nm, approximately 100 nm, approximately 200 nm, approximately 500 nm, approximately 1000 nm, approximately 2000 nm, approximately 5000 nm, approximately 10,000 nm, approximately 20,000 nm, approximately 50,000 nm, or approximately 100,000 nm, including ranges between any of the foregoing values), with an example thickness of approximately 200 nm to approximately 500 nm.

The electroactive polymer element may further include particles of a material such as barium titanate, where such particles have a high dielectric constant. Particles, such as high dielectric constant particles, may be disposed within the nanovoids or dispersed throughout the polymer matrix of the nanovoided composite polymer and may have an average diameter between approximately 10 nm and approximately 1000 nm.

In some embodiments, the nanovoids may occupy at least approximately 10% of the volume of a nanovoided polymeric thin film (e.g., approximately 10% by volume, approximately 20% by volume, approximately 30% by volume, approximately 40% by volume, approximately 5% by volume, approximately 60% by volume, approximately 70% by volume, approximately 80% by volume, or approximately 90% by volume, including ranges between any of the foregoing values).

The voids may be either closed- or open-celled, or a combination thereof. For open-celled voids, the void size (d) may be the minimum average diameter of the cell. The voids may be any suitable size and, in some embodiments, the voids may approach the scale of the thickness of the polymeric layer.

In some embodiments, the nanovoids may be randomly or irregularly distributed throughout the polymer matrix, such that the nanovoids exhibit no periodic structure on length scales greater than 10 nm.

According to some embodiments, the nanovoids may be substantially spherical, although the void shape is not particularly limited. For instance, in addition to, or in lieu of spherical voids, the nanovoided polymer material may include voids that are oblate, prolate, lenticular, ovoid, etc., and may be characterized by a convex and/or a concave cross-sectional shape.

In some embodiments, the void size may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

In some embodiments, applying a voltage to the electrodes (e.g., the primary electrode 1140$a$ and/or the secondary electrode 1140$b$) may create at least approximately 10% strain (e.g., an amount of deformation in the direction of the applied force resulting from the applied voltage divided by the initial dimension of the material) in the electroactive polymer element(s) in at least one direction (e.g., an x, y, or z direction with respect to a defined coordinate system).

In some embodiments, the application of a voltage to one or more of the electroactive polymer elements may change the internal pressure of gasses within the nanovoided regions thereof. For example, gasses may diffuse either into or out of the electroactive polymer element during dimensional changes associated with its deformation. Such changes in the electroactive polymer elements can affect, for example, the hysteresis of an electroactive device (e.g., electroactive device 1100) incorporating the electroactive polymer during dimensional changes, and also may result in drift when the electroactive polymer element's dimensions are rapidly changed.

Accordingly, in some embodiments, the nanovoids may be filled with a gas to suppress electrical breakdown of the electroactive polymer element (for example, during deformation). The gas may include air, nitrogen, oxygen, argon, sulfur hexafluoride, an organofluoride and/or any other suitable gas. In some embodiments, such a gas may have a high dielectric strength.

In another aspect, the electroactive device (e.g., an actuator) 1100 may have a sealing layer (not shown) applied to the edges of the electroactive device 1100, and/or to one or more of the electrodes, or a combination thereof. Suitable sealing layers may include thin film layers of an inorganic material, such as silica, applied with any suitable method, including, for example, atomic layer deposition (ALD), physical vapor deposition (PVD), chemical vapor deposition (CVD), or the like. The thin film layers may also be made from one or more dyads of a polymer layer and an inorganic layer. In some embodiments, the sealing layer may also include a barrier material, such as polychlorotrifluoroethylene (PCTFE) and/or other polymer, applied by solvent and/or with initiated-CVD.

According to some embodiments, the voids may be at least partially filled (e.g., entirely filled) with an electroactive material. For instance, following removal of the sacrificial phase to create the nanovoids, the nanovoids may be backfilled with an electroactive polymer to form the nanovoided composite. In such an example, the polymer-forming phase of the resin-containing layer may be elastomeric but not electroactive such that the electroactive material is incorporated into the composite following curing of the polymer-forming phase.

An example method of manufacturing a nanovoided composite polymer is summarized in the flow diagram shown in FIG. 12. The method 1200 includes, at step 1201, forming a resin-containing layer over a substrate, where the resin-containing layer includes a polymer-forming phase and a sacrificial phase, at step 1202, curing the polymer-forming phase to form a polymer matrix containing the sacrificial phase and, at step 1203, removing the sacrificial phase selectively with respect to the polymer matrix to form a nanovoided composite polymer including the polymer matrix and nanovoids dispersed throughout the polymer matrix.

Embodiments of the present disclosure may include or be implemented in conjunction with an artificial reality system. Artificial reality is a form of perceived reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in artificial reality and/or are otherwise used (e.g., perform activities) in artificial reality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
   forming a resin-containing layer over a substrate, the resin-containing layer including a polymer-forming phase and a sacrificial phase;
   curing the polymer-forming phase to form a polymer matrix containing the sacrificial phase;
   removing the sacrificial phase selectively with respect to the polymer matrix to form a nanovoided composite polymer including the polymer matrix and nanovoids dispersed throughout the polymer matrix; and
   partially de-crosslinking the polymer matrix after removing the sacrificial phase.

2. The method of claim 1, wherein the resin-containing layer is formed from a mixture comprising the polymer-forming phase and the sacrificial phase.

3. The method of claim 1, wherein the sacrificial phase is randomly dispersed throughout the polymer-forming phase.

4. The method of claim 1, wherein the sacrificial phase comprises a polymerizable phase.

5. The method of claim 1, wherein curing the polymer-forming phase comprises exposing the resin-containing layer to radiation.

6. The method of claim 1, further comprising forming a mask over the resin-containing layer to block portions of the resin-containing layer, wherein forming the polymer matrix comprises exposing portions of the resin-containing layer unblocked by the mask to radiation.

7. The method of claim 6, wherein the mask comprises a phase-shift mask.

8. The method of claim 1, wherein the polymer-forming phase and the sacrificial phase comprise respective blocks of a block co-polymer.

9. The method of claim 1, further comprising incorporating an electroactive polymer within the nanovoids.

10. The method of claim 1, wherein the nanovoids are regularly dispersed throughout the polymer matrix with a periodic structure having a repeat distance in at least one dimension of approximately 20 nm to approximately 1000 nm.

11. The method of claim 1, wherein removing the sacrificial phase comprises at least one of dissolution, sublimation, decomposition or melting.

12. The method of claim 1, further comprising self-assembling the sacrificial phase within the resin-containing layer.

13. The method of claim 1, wherein removing the sacrificial phase comprises exposing the sacrificial phase to increasingly non-polar solvent compositions over the course of the exposure.

14. The method of claim 1, further comprising forming a coating over at least a portion of an inner surface of the nanovoids, wherein the coating comprises a material having a Young's modulus of at least 10 GPa.

* * * * *